United States Patent
Yakabe et al.

(10) Patent No.: US 7,866,038 B2
(45) Date of Patent: Jan. 11, 2011

(54) THROUGH SUBSTRATE, INTERPOSER AND MANUFACTURING METHOD OF THROUGH SUBSTRATE

(75) Inventors: Masami Yakabe, Tokyo (JP); Kenichi Kagawa, Kawasaki (JP); Tomohisa Hoshino, Amagasaki (JP)

(73) Assignee: Tokyo Electron Limited (JP)

( * ) Notice: Subject to any disclaimer, the term of this patent is extended or adjusted under 35 U.S.C. 154(b) by 879 days.

(21) Appl. No.: 11/631,638

(22) PCT Filed: Jul. 5, 2005

(86) PCT No.: PCT/JP2005/012425

§ 371 (c)(1),
(2), (4) Date: Jan. 5, 2007

(87) PCT Pub. No.: WO2006/004128

PCT Pub. Date: Jan. 12, 2006

(65) Prior Publication Data

US 2007/0246253 A1    Oct. 25, 2007

(30) Foreign Application Priority Data

Jul. 6, 2004  (JP) ............................. 2004-199871
Jul. 6, 2004  (JP) ............................. 2004-199872

(51) Int. Cl.
*H01K 3/10*    (2006.01)
(52) U.S. Cl. ........................................ 29/852; 174/262
(58) Field of Classification Search .................... 29/852; 174/262

See application file for complete search history.

(56) References Cited

U.S. PATENT DOCUMENTS

| | | | |
|---|---|---|---|
| 5,003,273 A | | 3/1991 | Oppenberg |
| 5,286,926 A | | 2/1994 | Kimura et al. |
| 6,221,758 B1 | * | 4/2001 | Liu et al. ................ 438/626 |
| 6,268,660 B1 | * | 7/2001 | Dhong et al. ............ 257/774 |
| 6,418,615 B1 | * | 7/2002 | Rokugawa et al. ......... 29/852 |

(Continued)

FOREIGN PATENT DOCUMENTS

CN    1358331    5/2000

(Continued)

OTHER PUBLICATIONS

European Search Report dated Feb. 24, 2009.

(Continued)

*Primary Examiner*—Derris H Banks
*Assistant Examiner*—Jeffrey Carley
(74) *Attorney, Agent, or Firm*—Finnegan, Henderson, Farabow, Garrett & Dunner, LLP

(57) ABSTRACT

A through substrate which comprises a silicon substrate (10) having a through hole (19) penetrating a front surface (11) and a back surface (12), a oxidized silicon film (13) being provided along the inner wall surface of the through hole (19), layers (14, 15) comprising Zn and Cu, respectively, being formed on the inner wall surface of the oxidized silicon film (13), and a Cu plating layer (18) which has been grown from a Cu seed layer (17) along the inner wall surface of layers (14, 15) comprising Zn and Cu, respectively, via an insulating layer (16) between them. The above through substrate can provide a through electrode capable of avoiding the noise due to the cross talk.

2 Claims, 7 Drawing Sheets

U.S. PATENT DOCUMENTS

| | | | |
|---|---|---|---|
| 6,617,681 | B1 | 9/2003 | Bohr |
| 6,848,177 | B2 * | 2/2005 | Swan et al. .................. 29/852 |
| 7,033,934 | B2 | 4/2006 | Iijima et al. |
| 7,217,888 | B2 * | 5/2007 | Sunohara et al. ............ 174/260 |
| 2002/0017399 | A1 * | 2/2002 | Chang et al. ................ 174/262 |
| 2003/0085471 | A1 | 5/2003 | Iijima et al. |
| 2003/0200654 | A1 * | 10/2003 | Omote et al. ................. 29/852 |
| 2003/0207566 | A1 | 11/2003 | Forbes et al. |
| 2005/0251997 | A1 * | 11/2005 | Homg et al. ................. 29/830 |

FOREIGN PATENT DOCUMENTS

| | | |
|---|---|---|
| EP | 0 926 931 A1 | 6/1999 |
| EP | 1 415 950 A2 | 5/2004 |
| JP | 11163192 | 6/1999 |
| JP | 2000-151114 | 5/2000 |
| JP | 2001-352017 | 12/2001 |
| JP | 2002-9193 | 1/2002 |
| JP | 2002-176101 | 6/2002 |
| JP | 2003-513451 | 4/2003 |
| JP | 2004-63725 | 2/2004 |
| JP | 2004-119606 | 4/2004 |
| JP | 2004-128006 | 4/2004 |
| JP | 2004-146445 | 5/2004 |
| JP | 2006-19455 | 1/2006 |
| KR | 2003-0038445 | 5/2003 |
| WO | WO 02/078087 | 10/2002 |

OTHER PUBLICATIONS

European Search Report.

* cited by examiner

THROUGH SUBSTRATE, INTERPOSER AND MANUFACTURING METHOD OF THROUGH SUBSTRATE

TECHNICAL FIELD

The present invention relates to a through substrate, an interposer and a manufacturing method of the through substrate, and more particularly, to a through substrate and an interposer that can be used as a signal-flow path, and a manufacturing method of the through substrate.

BACKGROUND ART

A conventional multilayer wiring circuit substrate has a problem in that a crosstalk noise is generated in signal wirings because signal lines are close to each other due to high density of wiring layers, and an operation defect is generated in a driving element of the circuit. A method to solve the above problem is disclosed in Japanese Unexamined Patent Publication No. 2004-63725, for example.

According to that document, a coaxial line having a coaxial structure is formed in a substrate and used as a signal wiring layer.

The conventional method of eliminating the crosstalk noise has been performed as described above. However, there is a problem in the Japanese Unexamined Patent Publication No. 2004-63725 such that the constitution in the substrate is complicated because the noise is eliminated by arranging the coaxial structure in parallel with the substrate and arranging it in the vicinity of a layer at a ground potential or a power supply potential.

DISCLOSURE OF THE INVENTION

The present invention was made to solve the above problem and it is an object of the present invention to provide a through substrate and an interposer that can eliminate a noise due to crosstalk and a manufacturing method of that through substrate.

A through substrate according to the present invention comprises a substrate having a through hole provided between its front and back surfaces, a first conductive layer provided along the inner wall surface of the through hole and having an inner wall surface inside, and a second conductive layer provided along the inner wall surface of the first conductive layer through an insulating layer.

The through substrate according to the present invention comprises the first conductive layer provided along the inner wall surface of the through hole provided between the front and back surface of the substrate, and the second conductive layer provided along the inner wall surface of the first conductive layer through the insulating layer. Since the second conductive layer is surrounded by the first conductive layer through the insulating layer in the through hole, a coaxial cable constitution in which a shielding property is improved can be provided.

As a result, the through substrate can be provided which can eliminate the noise due to crosstalk.

Preferably, the first conductive layer operates as a shield line and the second conductive layer operates as a signal line.

The substrate may be an insulator substrate or may be a semiconductor substrate.

When the substrate is the semiconductor substrate, it further comprises an insulating layer between the inner wall surface of the through hole and the first conductive layer.

The through hole may be the through hole of an interposer.

According to another aspect of the present invention, a manufacturing method of a through substrate comprises a step of preparing a substrate having a front surface and a back surface, a step of forming a through hole in the substrate, a step of forming a first conductive layer having an inner wall surface inside, along the inner wall surface of the through hole, and a step of forming a second conductive layer along the inner wall surface of the first conductive layer through an insulating layer.

Preferably, the step of preparing the substrate having the front and back surfaces comprises a step of preparing a semiconductor substrate, and before the step of forming the first conductive layer having the inner wall surface inside along the inner wall surface of the through hole, it further comprises a step of forming an insulating layer having an inner wall surface inside along the inner wall surface of the through hole and then a step of forming the second conductive layer along the inner wall surface of the insulating layer.

According to still another aspect of the present invention, an interposer comprises a substrate, a first conductive layer provided on the substrate, and a second conductive layer provided on the first conductive layer on the substrate through an insulating layer.

Since the interposer comprises the substrate, the first conductive layer provided on the substrate, and the second conductive layer provided on the first conductive layer on the substrate through the insulating layer, a passive element can be formed with the first conductive layer and the second conductive layer isolated by the insulating layer.

As a result, the interposer having a multifunction in which the passive element is formed can be provided.

Preferably, the second conductive layer is surrounded by the first conductive layer through the insulating layer.

More preferably, the first conductive layer and the second conductive layer constitute a passive element.

The first conductive layer is held at a first potential and the second conductive layer may be held at a different second potential or at the same potential as the first potential.

In addition, the first conductive layer may operate as a shield line and the second conductive layer may operate as a signal line.

Preferably, the substrate comprises a conductor or semiconductor substrate, and when the substrate is the conductor or the semiconductor substrate, the substrate may be held at a potential different from those of the first conductive layer and the second conductive layer, or may be held at the same potential as at least one of the potential of the first conductive layer or the potential of the second conductive layer.

Here, when the first conductive layer is held at the first potential and the second conductive layer is held at the second potential different from the first potential, a capacitor can be formed. When the first conductive layer and the second conductive layer are held at the same potential, they can function as a guard electrode.

Preferably, the first conductive layer is surrounded by the second conductive layer through the insulating layer. Since the first conductive layer is surrounded by the second conductive layer through the insulating layer, a coaxial cable in which a shielding property is improved can be provided.

As a result, the interposer can be provided which can eliminate a noise due to crosstalk.

BEST MODE FOR CARRYING OUT THE INVENTION

Figure 1A:
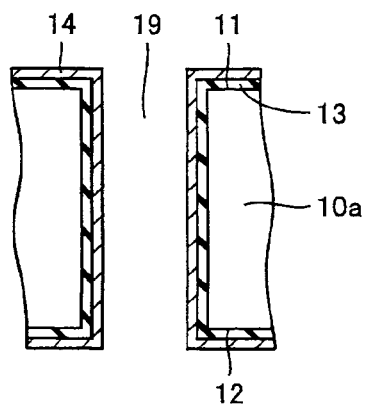
FIG. 1A is a view showing a manufacturing step of a through substrate when a semiconductor substrate is used as a substrate.
Figure 1B:
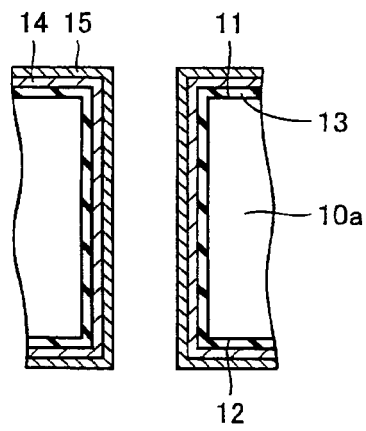
FIG. 1B is a view showing a manufacturing step of the through substrate when the semiconductor substrate is used as the substrate.
Figure 1C:
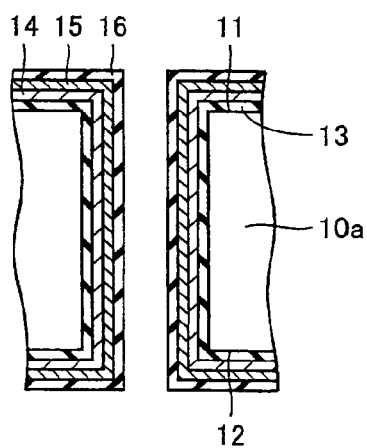
FIG. 1C is a view showing a manufacturing step of the through substrate when the semiconductor substrate is used as the substrate.

One embodiment of the present invention will be described with reference to the drawings hereinafter. FIGS. 1A to 1D show manufacturing steps of a through substrate according to one embodiment of the present invention step by step. Here, the through substrate means a substrate having a through hole provided from the front surface to the back surface of the substrate and includes a printed circuit board (including a flexible printed circuit board) and an interposer (including a silicon interposer).

Referring to FIG. 1, first, a silicon substrate (through substrate) 10 having a front surface 11 and a back surface 12 and comprises a plurality of through holes provided between both surfaces is prepared. In addition, the whole substrate 10 is covered with a silicon oxide film 13. Then, a Zn layer 14 is formed inside the through hole 19 and around the front and back surfaces by electroless plating (FIG. 1A). Then, a Cu layer 15 is formed on the Zn layer 14 by electroless plating also (FIG. 1B) (these layers become a first conductive layer). Then, an insulating layer 16 is formed on the Cu layer 15 by sputtering, for example. As this insulating layer 16, a silicon oxide film or a silicon nitride film may be formed by CVD instead of sputtering. Alternatively, a resin may be electrodeposited. Here, an electrodeposited resin includes PTFE, resist, polyimide, polyamide and the like.

In addition, while the sputtering or CVD needs a vacuum device, the resin electrodeposition does not need it, so that the resin electrodeposition is preferable.

Figure 1D:
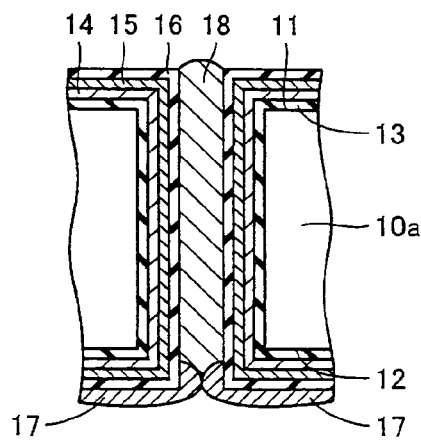
FIG. 1D is a view showing a manufacturing step of the through substrate when the semiconductor substrate is used as the substrate.
Figure 2A:
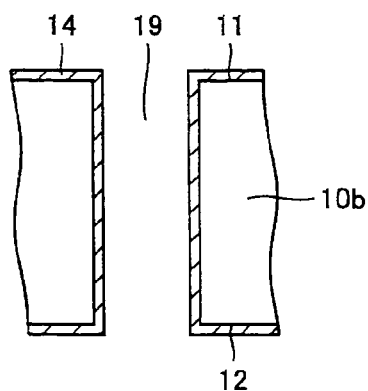
FIG. 2A is a view showing a manufacturing step of a through substrate when an insulator substrate is used as a substrate.
Figure 2B:
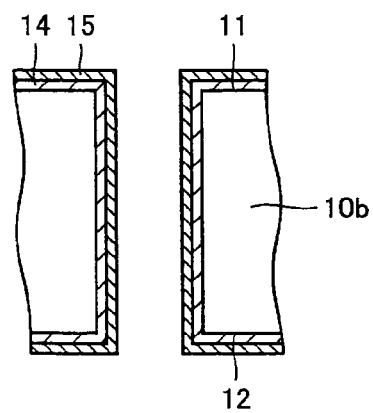
FIG. 2B is a view showing a manufacturing step of the through substrate when the insulator substrate is used as the substrate.
Figure 2C:
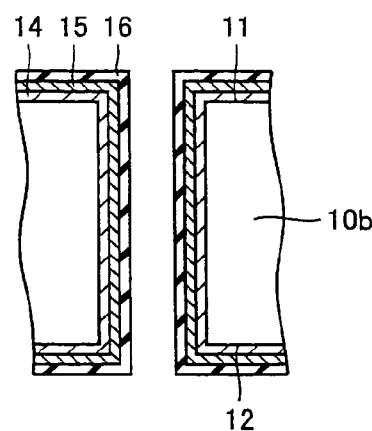
FIG. 2C is a view showing a manufacturing step of the through substrate when the insulator substrate is used as the substrate.
Figure 2D:
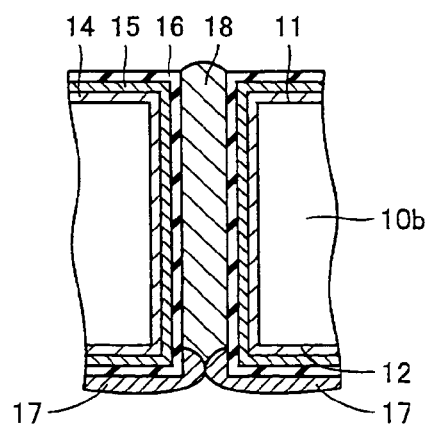
FIG. 2D is a view showing a manufacturing step of the through substrate when the insulator substrate is used as the substrate.

Then, a seed layer 17 of Cu, for example is formed on the side of the back surface 12 of the through hole 19 and this is provided as an electrode of electrolytic plating or electroless plating. Then, a conductive layer (second conductive layer) 18 is formed by growing a plated layer in the through hole formed of the insulating layer 16 from the electrode to the front surface 11 (FIG. 1D).

Thus, the through hole 19 of the substrate 10 is filled with the conductive layer 18, the insulating layer 16, conductive layers 15 and 14 from its center, so that a coaxial cable configuration having an improved shielding property can be provided. Since this configuration is a via hole having the configuration of a coaxial cable in which a noise can be reduced and parasitic capacity can be reduced and a signal can be transmitted at high speed, this configuration is referred to as the coaxial via hole hereinafter.

Next, another embodiment of the present invention will be described. Although the silicon substrate is used in the above embodiment, in this embodiment, as a through substrate, an insulator substrate such as a glass substrate or sapphire substrate is used.

FIGS. 2A to 2D show manufacturing steps when such insulator substrate is used, and correspond to FIGS. 1A to 1D. Referring to FIGS. 2A to 2D, since the through substrate is the insulator substrate in this embodiment, the insulating layer 13 such as the oxide film provided along the inner wall of the through hole in the above embodiment is not needed.

Since steps other than the above are the same as those in the above embodiment, its description will not be reiterated.

Figure 3:
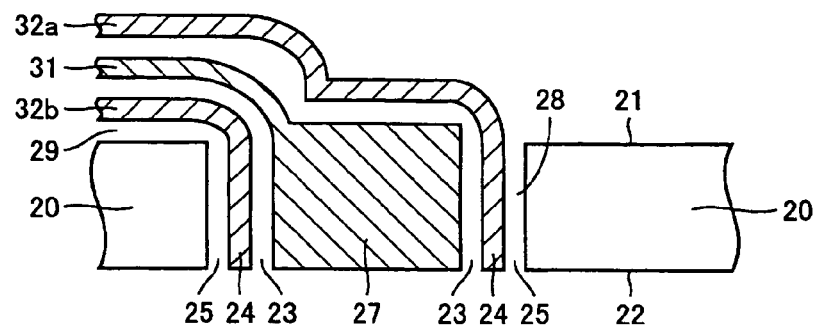
FIG. 3 is a sectional view showing the vicinity of a through hole of an interposer according to one embodiment of the present invention.

Next, a description will be made of a case where the through substrate according to one embodiment of the present invention is applied to an interposer. FIG. 3 is a sectional view showing the vicinity of the through hole of an interposer when the present invention is applied to the interposer.

Referring to FIG. 3, the interposer has a conductive layer (second conductive layer) 27 in a through hole 28 and the conductive layer 27 is surrounded by a conductive layer (second conductive layer) 24 through an insulating layer 23.

Since the conductive layer 27 is surrounded by the conductive layer through the insulating layer 23, a coaxial cable is constituted. As a result, the interposer has a noise-resistant property.

The conductive layer 24 extends on a substrate 20 through an insulating layer 29 with the layer 24 surrounding the conductive layer 27 through the insulating layer 23. At this time, as shown in FIG. 3, the conductive layer 27 is used as a signal line 31 and the conductive layer 24 is used as shield wirings 32a and 32b.

In addition, the signal line 31 and the shield wirings 32a and 32b may have a planar configuration on the surface of the substrate 20 instead of a cylindrical configuration.

Here, the shield wiring is not connected to the signal line and it is in a floating state. However, according to need, the signal line and the shield line may be connected to have the same potential as will be described below.

Figure 4A:
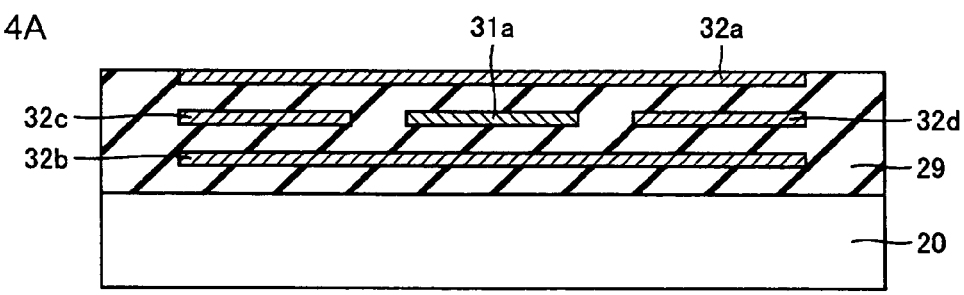
FIG. 4A is a view showing arrangement of wiring layers on a substrate of an interposer.

Next, a description will be made of a case where the planar wiring is arranged on the surface of the substrate 20 as described above. FIG. 4A is a sectional view showing the interposer in that case.

Referring to FIG. 4A, a conductive layer 31a to become a signal line is provided in the center and conductive layers 32a, 32b, 32c and 32d to become shield layers are formed on upper, lower, right and left sides so as to surround the conductive layer 31a through an insulating layer 29 to each other on the substrate 20 of the interposer.

Figure 4B:
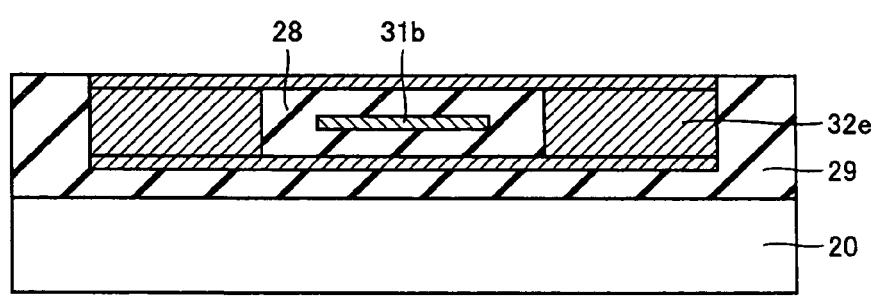
FIG. 4B is a view showing arrangement of wiring layers on a substrate of an interposer.

FIG. 4B is a variation of FIG. 4A. Its constitution is similar to that in FIG. 4A, except that a conductive layer 32e connecting all conductive layers to become shield lines and the conductive layer 32e surrounds a conductive layer 31b to become a signal line through an insulating layer 28. Thus, a wiring layer having a coaxial structure in the interposer can be easily constituted.

Figure 5A:
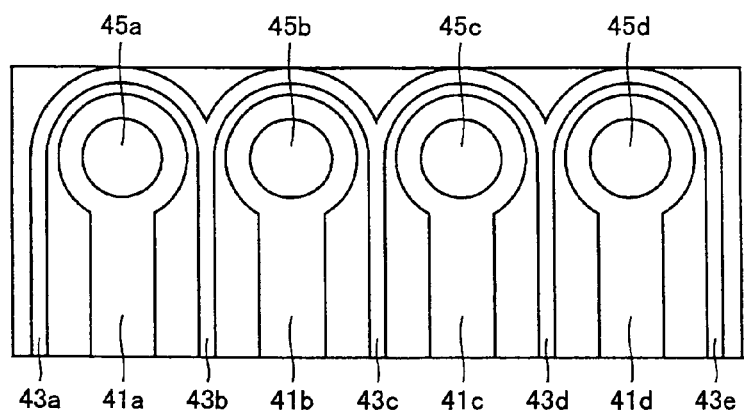
FIG. 5A is a view showing a constitution when a shielding function is provided in an interposer.
Figure 5B:
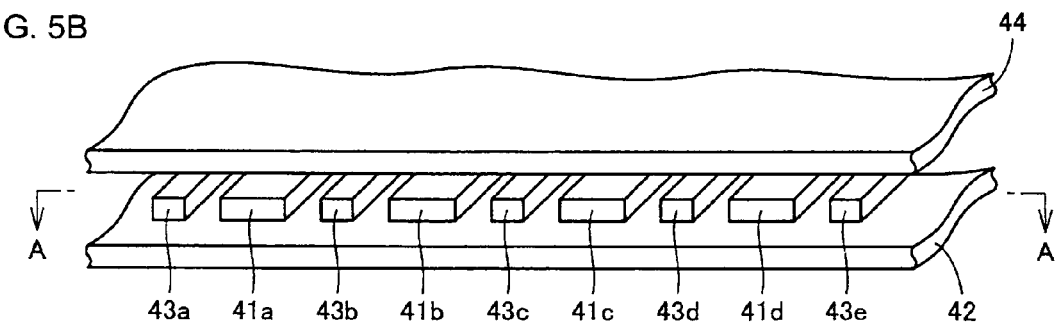
FIG. 5B is a view showing the constitution when the shielding function is provided in the interposer.

FIGS. 5A and 5B show an electrode pad. FIG. 5A is a plan view (plan view taken along line A-A in FIG. 5B) and FIG. 5B is a perspective view corresponding to FIGS. 4A and 4B. In addition, a substrate is not shown here.

Referring to FIGS. 5A and 5B, there are shown signal lines 41a to 41d connected to four electrode pads 45a to 45d, respectively. The signal lines 41a to 41d are surrounded by shield electrodes 42, 43 and 44 provided on upper, lower, right and left sides.

Next, a still another embodiment of the present invention will be described. According to this embodiment, a passive element such as coil L, a capacitor C and resistor R is formed in an interposer.

Figure 6A:
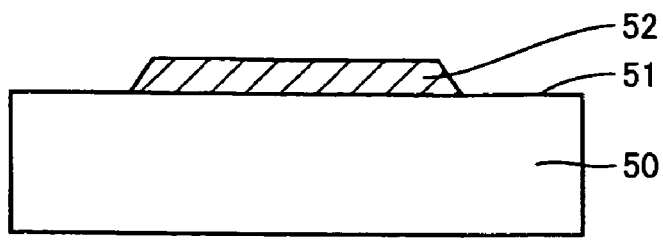
FIG. 6A is a view showing a process when a passive element is formed in an interposer.
Figure 6B:
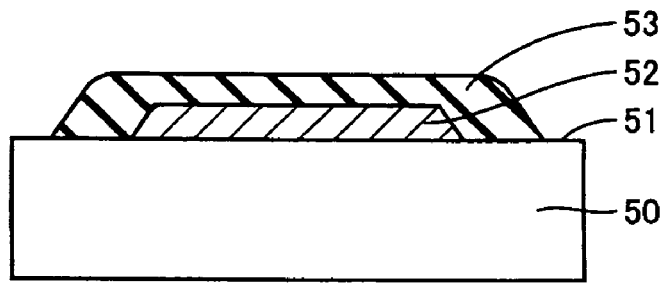
FIG. 6B is a view showing a process when the passive element is formed in the interposer.

FIGS. 6A to 6D show forming steps of the passive element step by step. In addition, the detailed description of a photolithography step is omitted here. Referring to FIGS. 6A to 6D, first, a silicon substrate 50 is prepared. Although it is not shown, the surface of the substrate is covered with an insulating layer such as $SiO_2$ or SiN. Then, a conductive layer 52 is formed of metal on a surface 51 of the substrate 50 (FIG. 6A). Then, an insulating layer 53 is formed on the conductive layer 52 (FIG. 6B). When the insulating layer 53 is formed, a silicon oxide film or a silicon nitride film may be formed by CVD, or sputtering or resin electrodeposition may be used. Then, a via hole is provided at a part of the insulating layer 53 to be connected to a conductive layer 54 formed on the insulating layer 53. Then, an insulating layer 55 is formed thereon.

Figure 6C:
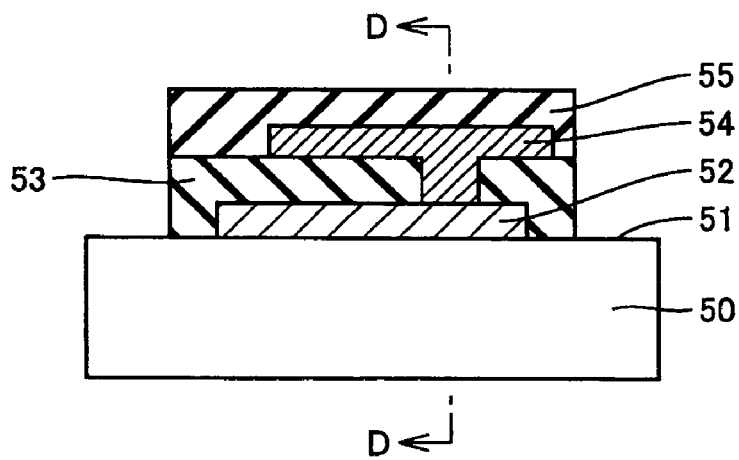
FIG. 6C is a view showing a process when the passive element is formed in the interposer.
Figure 6D:
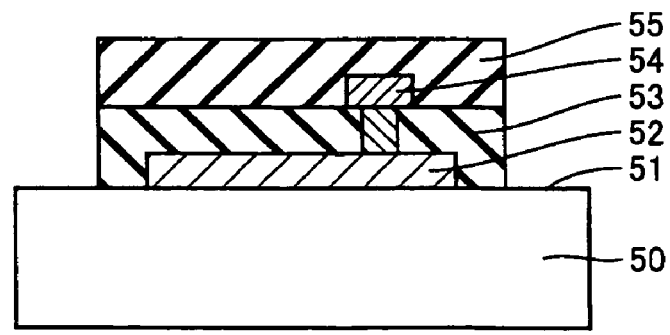
FIG. 6D is a view showing a process when the passive element is formed in the interposer.

FIG. 6D is a sectional view taken along line D-D in FIG. 6C. Referring to FIGS. 6C and 6D, there is provided a constitution in which the conductive layer 52 and the conductive layer 54 are opposed to each other through the insulating layer 53 in the interposer. This constitution can be used as a capacitor. In addition, when the conductive layer 52 and the conductive layer 54 are brought to the same potential, they can be a signal line and a shield line, respectively. Thus, the passive element can be formed in the interposer.

Next, a description will be made of a specific example in which a plurality of functional components are constituted in an interposer using the constitution shown in FIGS. 6A to 6D.

Figure 7A:
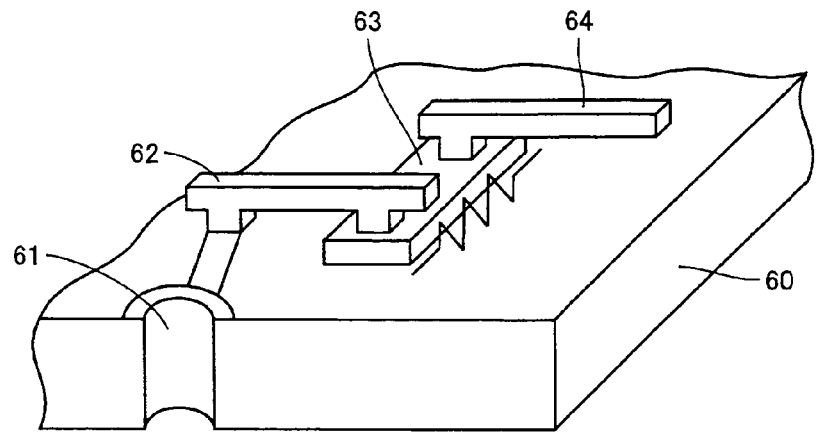
FIG. 7A is a perspective view showing a functional element constituted in an interposer.
Figure 7B:
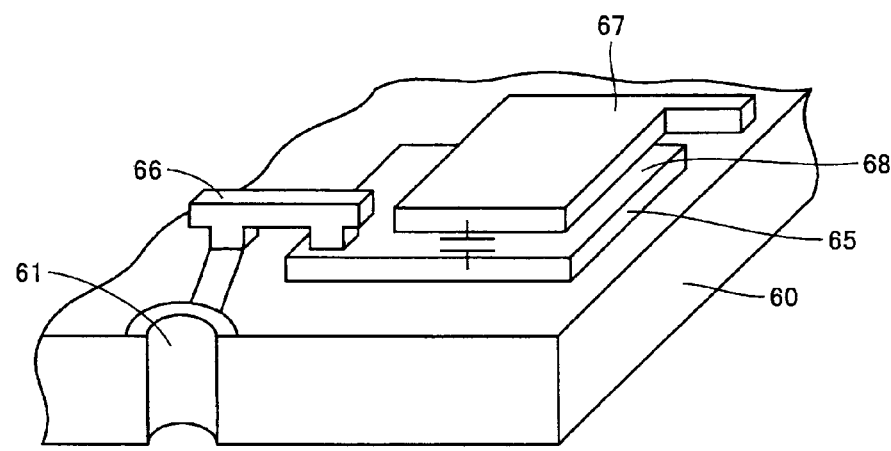
FIG. 7B is a perspective view showing a functional element constituted in an interposer.
Figure 7C:
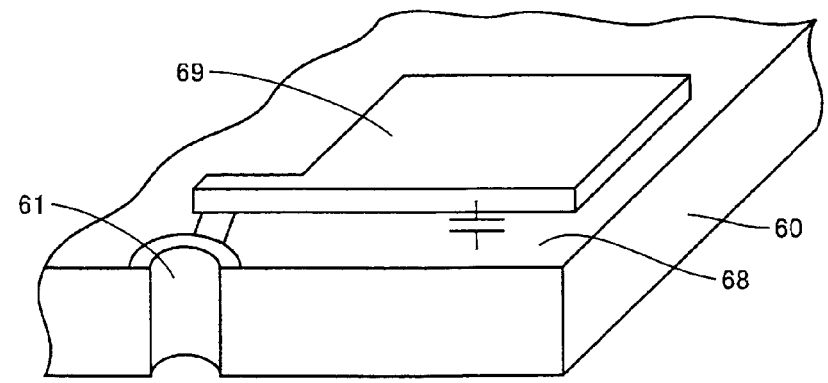
FIG. 7C is a perspective view showing a functional element constituted in an interposer.

FIGS. 7A to 7C are perspective views showing the specific example. Here, an oxide film on a substrate 60 is not shown. FIG. 7A is a perspective view when the resistor R is formed. Referring to FIG. 7A, a metal conductive layer 62 is formed on the second layer so as to be connected to a coaxial via 61 provided in a silicon substrate 60. A metal conductive layer 64 is formed on the same layer. Meanwhile, a polysilicon layer 63 is formed on the surface of the substrate 60 and both ends thereof are connected to the first and second conductive layers 62 and 64.

Since the polysilicon layer 63 has far greater resistance value than metal, it can be used as a resistor layer.

Next, another example will be described. FIG. 7B is a perspective view when the capacitor C is formed. Referring to FIG. 7B, a metal conductive layer 66 is formed on the second layer so as to be connected to the coaxial via 61 provided in the silicon substrate 60. A metal conductive layer 67 is formed on the same second layer. Meanwhile, a metal conductive layer 65 is formed on the surface of the substrate 60 so as to sandwich an insulating layer 68 with the conductive layer 67, and the conductive layer 66 and the conductive layer 65 are connected.

Thus, since the insulating layer 68 is sandwiched between the conductive layer 65 and conductive layer 67, a function as the capacitor C can be provided.

Next, still another example will be described. FIG. 7C is a perspective view when another capacitor C is formed. Referring to FIG. 7C, a metal conductive layer 69 is formed on the surface of the substrate 60 so as to be connected to the coaxial via 61 provided in the silicon substrate 60 through an insulating layer 68. Thus, since the insulating layer 68 is sandwiched between the substrate 60 and conductive layer 69, a function as the capacitor C can be provided.

Figure 8:
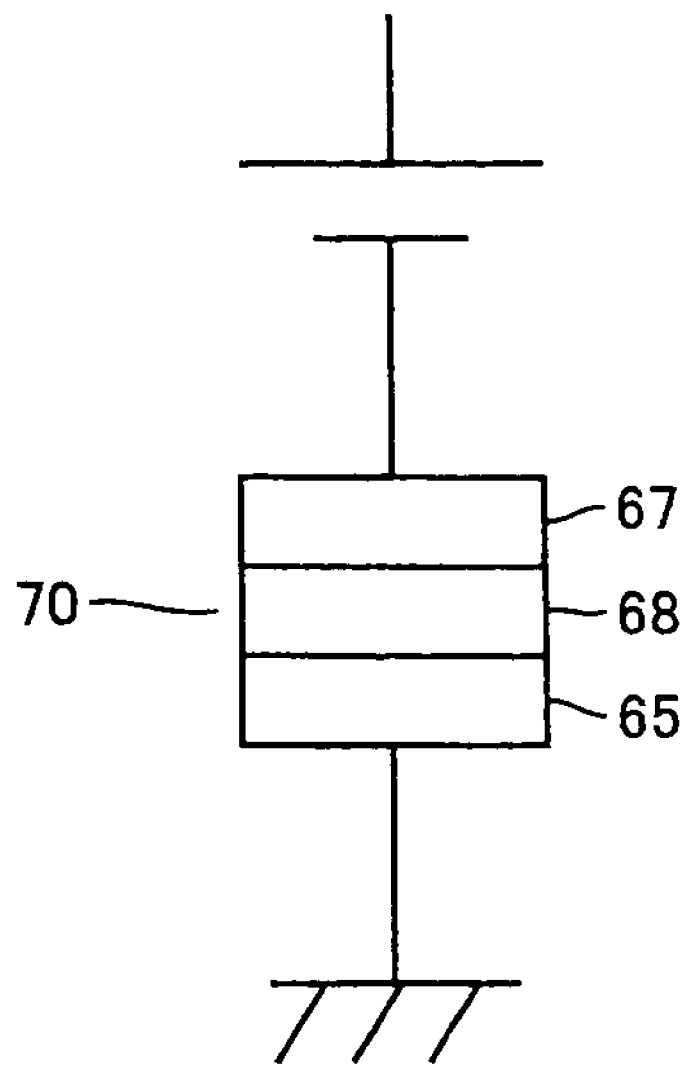
FIG. 8 is a circuit diagram showing a constitution comprising a conductive layer and an insulating layer.

Next, a description will be made of the general constitution of the functional elements constituted in the interposer shown in FIGS. 6A to 6d and FIGS. 7A to 7C. FIG. 8 is a circuit diagram showing a constitution 70 comprising the conductive layer and the insulating layer shown in FIGS. 6A to 6D and FIGS. 7A to 7C. Here, the constitution shown in FIG. 7B is shown as one example.

Referring to FIG. 8, the conductive layers 65 and 67 are connected through the insulating layer 68. Here, it is assumed that the conductive layer 65 is grounded and the conductive layer 67 is connected to a power supply. In this case, the constitution 70 functions as the capacitor C.

Meanwhile, when the conductive layer 65 and the conductive layer 67 are connected to be at the same potential, they function as a guard electrode that can reduce parasitic capacity and functions as a shield wiring.

In addition, when the substrate is the semiconductor substrate such as the silicon substrate or the conductor substrate as shown in the above embodiments, the substrate may be held at a potential different from those of the conductive layer 65 and the conductive layer 67 or may be held at the same potential as that of at least one of the conductive layer 65 and the conductive layer 67.

Although the through hole is circular or cylindrical in the above description of the embodiments, it may be rectangular or polygonal.

Although the substrate is the silicon substrate in the above description of the embodiment, it may be an insulator substrate such as a glass substrate or a sapphire substrate.

INDUSTRIAL APPLICABILITY

The through substrate and the interposer according to the present invention can be advantageously applied to a substrate having the same function as that of a coaxial cable.

What is claimed is:

1. A manufacturing method of a through substrate comprising:
    a step of preparing a substrate having a front surface and a back surface;
    a step of forming a through hole in said substrate;
    a step of forming a first conductive layer having an inner wall surface inside, along the inner wall surface of said through hole; and
    a step of forming a second conductive layer along the inner wall surface of said first conductive layer through an insulating layer; wherein
    said step of forming a second conductive layer comprises:
        a step of forming a metal seed layer on one surface side of said substrate, and
        a step of growing a plating layer from said seed layer to the other surface side of said substrate.

2. The manufacturing method of the through substrate according to claim 1, wherein said step of preparing the substrate comprises a step of preparing a semiconductor substrate, and before the step of forming the first conductive layer having the inner wall surface inside, along the inner wall surface of said through hole, it further comprises a step of forming an insulating layer having an inner wall surface inside, along the inner wall surface of said through hole and then a step of forming said first conductive layer along the inner wall surface of the insulating layer.

* * * * *